United States Patent
Huang et al.

(10) Patent No.: US 8,033,121 B2
(45) Date of Patent: Oct. 11, 2011

(54) LOW EDDY CURRENT CRYOGEN CIRCUIT FOR SUPERCONDUCTING MAGNETS

(75) Inventors: Xianrui Huang, Clifton Park, NY (US); Paul Shadforth Thompson, Stephentown, NY (US); David Thomas Ryan, Niskayuna, NY (US); Gregory Alan Lehmann, Brookfield, WI (US); Timothy John Havens, Florence, SC (US)

(73) Assignee: General Electric Company, Schenectady, NY (US)

( * ) Notice: Subject to any disclaimer, the term of this patent is extended or adjusted under 35 U.S.C. 154(b) by 248 days.

(21) Appl. No.: 12/246,800

(22) Filed: Oct. 7, 2008

(65) Prior Publication Data

US 2009/0033450 A1   Feb. 5, 2009

Related U.S. Application Data

(62) Division of application No. 10/718,439, filed on Nov. 19, 2003, now Pat. No. 7,464,558.

(51) Int. Cl.
*F17C 7/02* (2006.01)
(52) U.S. Cl. ........................................... 62/51.1
(58) Field of Classification Search ............ 62/3.1, 62/47.1, 51.1; 335/216, 300
See application file for complete search history.

(56) References Cited

U.S. PATENT DOCUMENTS

| | | | |
|---|---|---|---|
| 4,601,493 A | 7/1986 | Ross et al. | |
| 4,726,199 A * | 2/1988 | Takano et al. | 62/505 |
| 4,782,671 A * | 11/1988 | Breneman et al. | 62/51.1 |
| 5,148,137 A * | 9/1992 | Purcell et al. | 335/301 |
| 5,349,297 A | 9/1994 | DeMeester et al. | |
| 5,412,363 A | 5/1995 | Breneman et al. | |
| 5,461,873 A | 10/1995 | Longsworth | |
| 5,696,476 A * | 12/1997 | Havens et al. | 335/216 |
| 6,100,693 A | 8/2000 | Eberler et al. | |
| 6,154,031 A * | 11/2000 | Hughes | 324/322 |
| 2005/0035764 A1 | 2/2005 | Mantone et al. | |

FOREIGN PATENT DOCUMENTS

| | | |
|---|---|---|
| EP | 0681189 | 2/2003 |
| EP | 0898130 | 4/2005 |
| JP | 57177509 A | 11/1982 |
| JP | 61179508 A | 8/1986 |
| JP | 02-323246 | 7/1992 |
| JP | 5003120 A | 1/1993 |
| JP | 07-049622 | 9/1996 |
| JP | 8250324 A | 9/1996 |
| JP | 11233334 A | 8/1999 |
| JP | 2002043117 A | 2/2002 |
| JP | 2002324707 A | 11/2002 |
| WO | WO9508743 A1 | 3/1995 |

* cited by examiner

*Primary Examiner* — Melvin Jones

(57) ABSTRACT

A low eddy current cryogen circuit for superconducting magnets including at least a first cooling coil made of an electrically conducting material and having at least one electrical isolator incorporated in the first cooling coil. The electrical isolator is located to inhibit induced eddy current loops due to inductive coupling of the first cooling coil with eddy current inducing field sources.

19 Claims, 4 Drawing Sheets

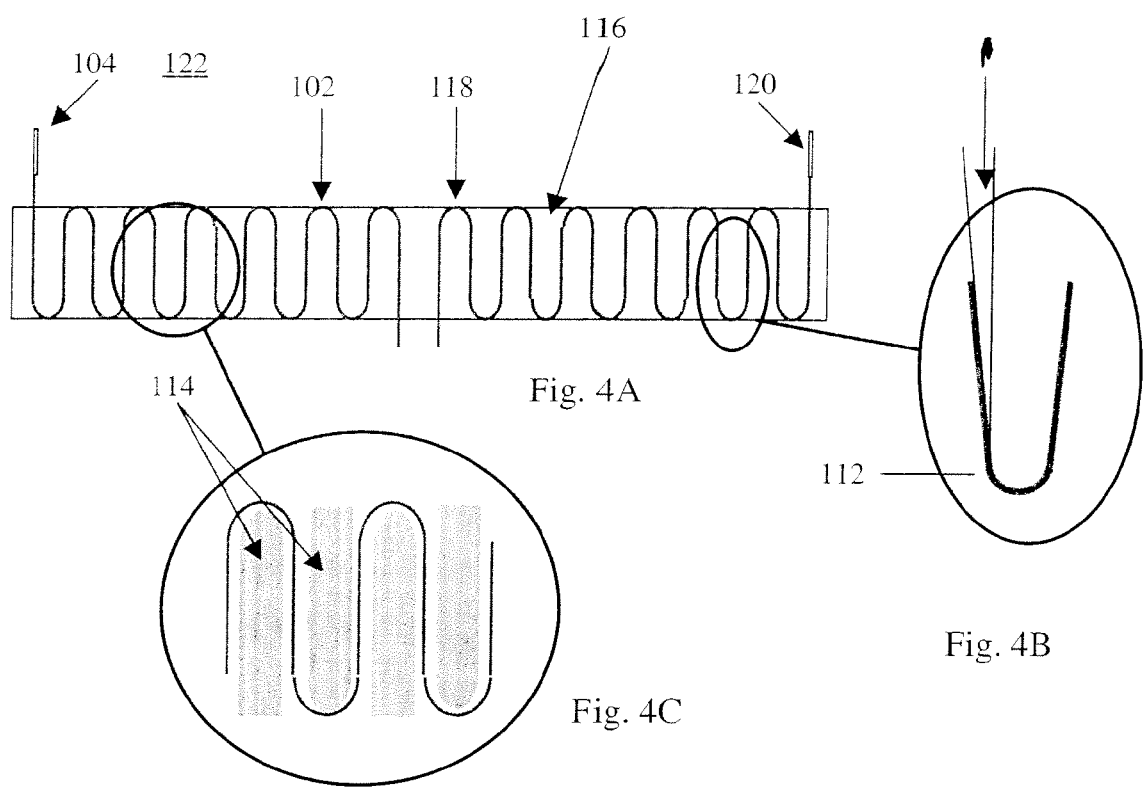

LOW EDDY CURRENT CRYOGEN CIRCUIT FOR SUPERCONDUCTING MAGNETS

CROSS-REFERENCE TO RELATED APPLICATIONS

This Application is a Divisional Patent Application of pending U.S. patent application Ser. No. 10/718,439, filed Nov. 19, 2003 titled, "Low Eddy Current Cryogen Circuit for Superconducting Magnets".

BACKGROUND OF THE INVENTION

This invention relates generally to methods and apparatus for cooling a superconducting magnet, and specifically to cooling a magnet used in a magnetic resonance imaging (MRI) system.

There are various magnetic imaging systems which utilize superconducting magnets. One example of an imaging system is a magnetic resonance imaging (MRI) system. MRI systems are used to image a portion of a patient's body.

Superconducting MRI systems typically utilize one superconducting magnet, often with multiple coils. An imaging volume is provided inside the magnet. A person or material is placed into an imaging volume and an image or signal is detected and then processed by a processor, such as a computer.

The majority of existing superconducting MRI magnets are made of a niobium-titanium material which is cooled to a temperature of 4.2 K with a cryostat. A typical superconducting magnet cryostat includes a liquid helium vessel, one or two thermal shields and a vacuum vessel. The thermal shields intercept radiation from the ambient atmosphere to the helium vessel. The heat load from this radiation is balanced with a refrigerator, such as a cryocooler, which provides cooling to the cryostat.

However, in addition to the heat from ambient atmosphere, there may be additional sources of heat. For example, when the cryostat components are exposed to magnetic fields, for instance the fringe field from an MRI gradient coil, eddy currents are produced. These eddy currents generate joule heating which increases the heat load to be removed by the refrigerator. Moreover, the magnetic fields produced by these eddy currents in the image volume generally have adverse impact on the imaging quality of the system. Prior attempts to address this problem consisted of reducing the AC field strength in the area of the superconducting coils and cryogenic components. However, this typically results in an adverse impact on the system performance.

BRIEF SUMMARY OF THE INVENTION

In accordance with one preferred aspect of the present invention, there is provided a low eddy current cryogen circuit for superconducting magnets comprising at least a first cooling coil comprising an electrically conducting material and at least one electrical isolator incorporated in the first cooling coil, the electrical isolator located to inhibit induced eddy current loops in the cryogen circuit due to inductive coupling of the first cooling coil with eddy current inducing field sources.

In accordance with one preferred aspect of the present invention, there is provided a method of cooling a superconducting magnet comprising providing a superconducting magnet in thermal contact with at least a first cooling coil incorporating at least one electrical isolator, the electrical isolator located to inhibit induced eddy current loops due to inductive coupling of the first cooling coil with eddy current inducing field sources and passing a cryogen through the first cooling coil.

In accordance with one preferred aspect of the present invention, there is provided an MRI system comprising a superconducting magnet and a low eddy current cryogen circuit, the low eddy current cryogen circuit having at least a first cooling coil in thermal contact with the superconducting magnet.

In accordance with one preferred aspect of the present invention, there is provided a method of making a cooling band comprising providing a first cooling coil and a second cooling coil, the first and second cooling coils having a substantially semicircular portion and affixing the first and second cooling coils to a flexible backing such that the first and second cooling coils form a substantially circular shape.

BRIEF DESCRIPTION OF THE DRAWINGS

FIG. 4A is a schematic illustration a method of making a cooling band according to an embodiment of the invention.

FIG. 4B is a detail view of the cooling band of FIG. 4A.

FIG. 4C is another detail view of the cooling band of FIG. 4A.

DETAILED DESCRIPTION OF THE INVENTION

The present inventors have realized that heat generated from eddy current loops in superconducting magnet systems, such as MRI systems, may be reduced without reducing the AC field strength in the area of the superconducting coils and cryogenic components. This can be accomplished through the use of a low eddy current cryogen circuit to cool the superconducting magnet. Specifically, this can be accomplished by providing cooling coils which have a least one electrical isolator incorporated in the cooling coils to inhibit induced magnetic fields due inductive coupling of the cooling coils with eddy current inducing field sources.

Figure 1:
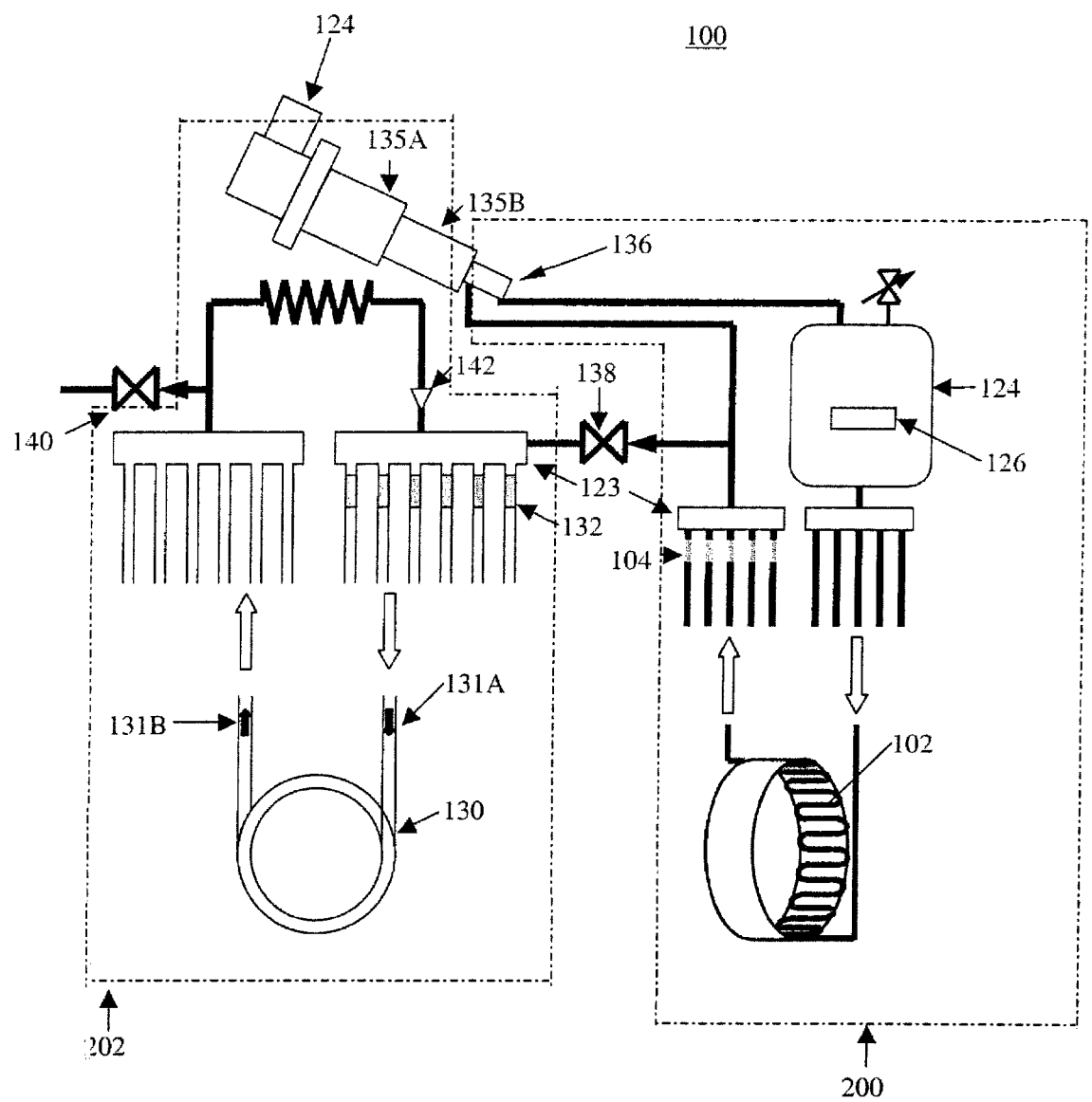
FIG. 1 is a schematic illustration of a low eddy current cryogen circuit illustrating several embodiments of the present invention.

FIG. 1 illustrates several aspects and embodiments of a low eddy current cryogen circuit 100 of the invention. In a preferred embodiment of the invention, the low eddy current cryogen circuit 100 includes at least one cooling coil 102. Typically, the cooling coil 102 is made of stainless steel or copper for ease of constructing a leak-tight circuit suitable for operation at cryogenic temperatures. However, any material having a suitable thermal conductivity may be used.

Typically, materials used for leak-tight cryogenic tubes are also electrically conducting. Because these materials are electrically conducting, eddy currents may be induced in the cooling coil 102 due to inductive coupling of the cooling coil 102 with various electromagnetic field sources, for example magnetic field sources or AC field sources. To inhibit these induced eddy current loops, at least one electrical isolator 104 is incorporated in the cooling coil 102. That is, the cooling coil 102 may fabricated by making a portion of the cooling coil 102 out of a non-electrically conducting material. For example, a portion of the cooling coil 102 may be made of a ceramic tube. By using a ceramic tube, the current path in the cooling coil 102 is interrupted, inhibiting the generation of induced eddy currents.

Figures 2A, 2B:
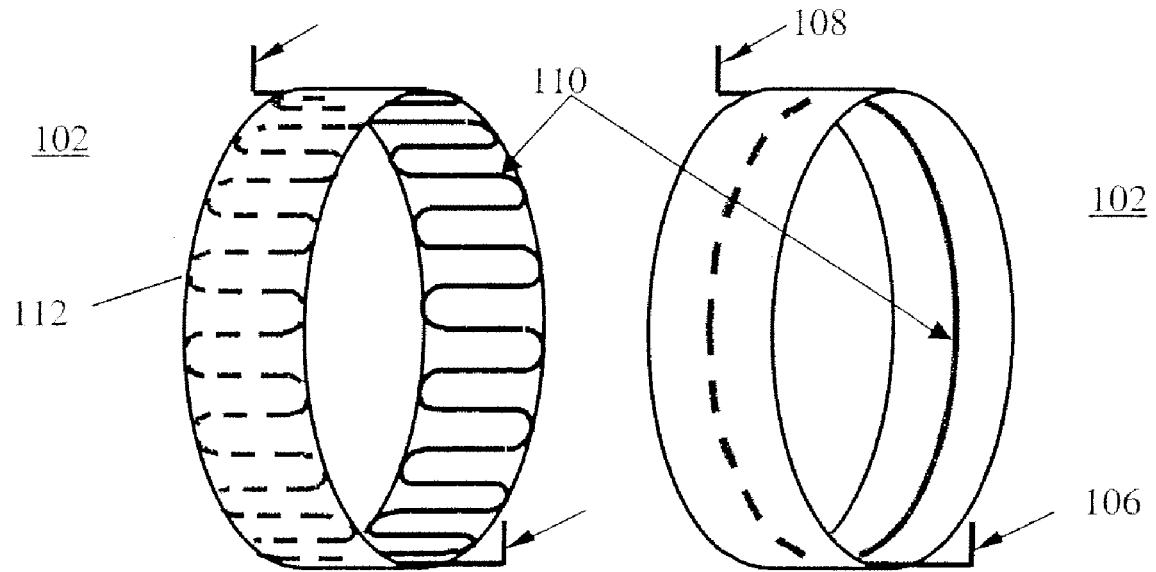
FIG. 2A is a schematic illustration of a cooling band according to an embodiment of the present invention.
FIG. 2B is a schematic illustration of a cooling band according to another embodiment of the present invention.

In one embodiment of the invention illustrated in FIG. 2B, the cooling coil 102 has an input portion 106, an output portion 108 and a semicircular portion 110. Typically, liquid cryogen is introduced to the cooling coil 102 via the input portion 106 at the bottom of the cooling coil 102. As heat is absorbed by the cooling coil 102, a portion of the liquid cryogen vaporizes. The cryogen vapor and any remaining liquid cryogen exits the cooling coil 102 via the output portion 108 at the top of the cooling coil 102.

Figure 5:
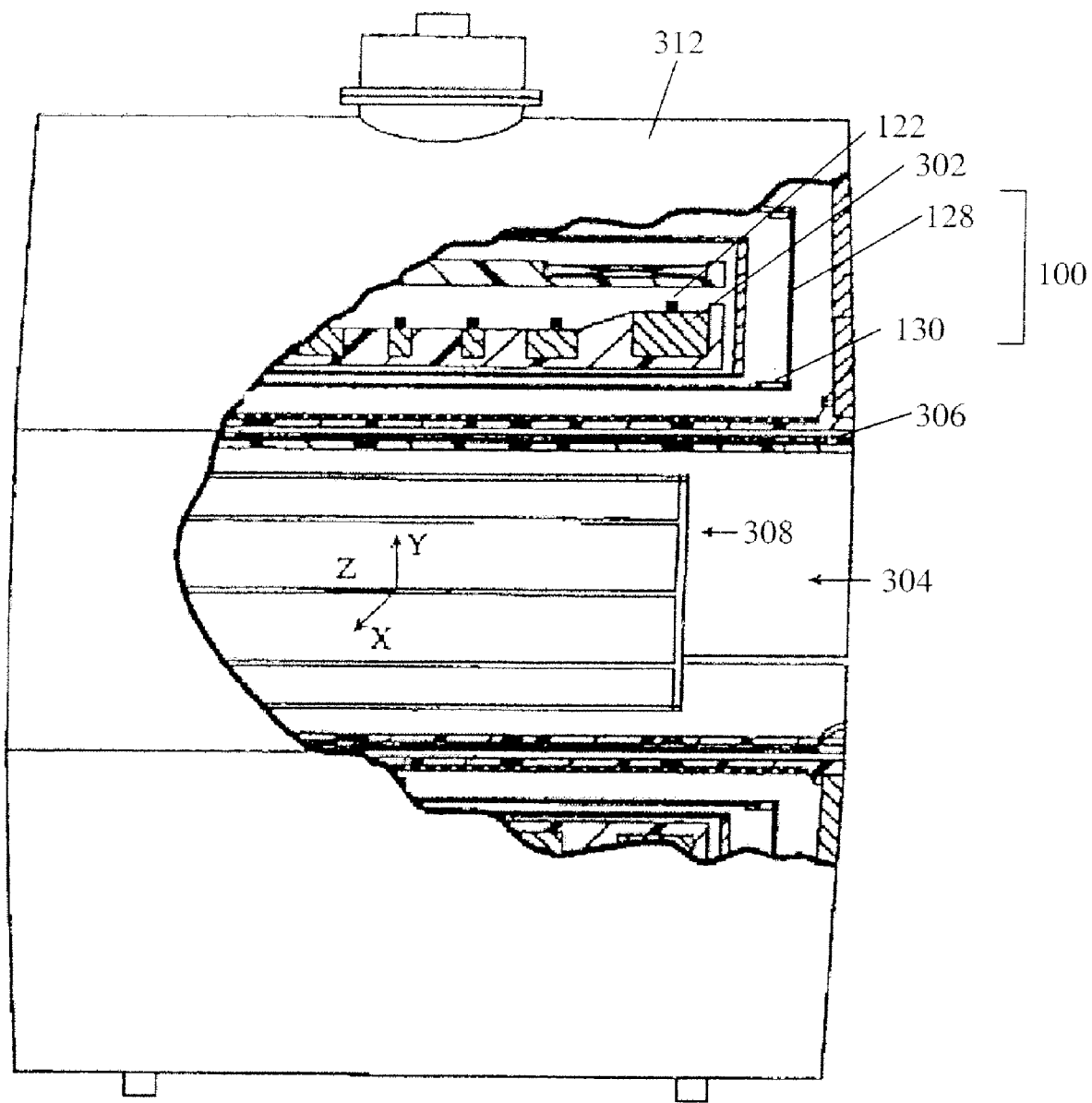
FIG. 5 is a schematic illustration of an MRI according to an embodiment of the present invention.

In one preferred embodiment, the semi-circular portion 110 is designed to cool a superconducting magnet of an MRI 300 (FIG. 5). However, the semi-circular portion may also be designed to cool superconducting magnets in other applications, such as magnetic separators, motors and generators.

FIG. 2A illustrates a cooling coil 102 according another embodiment. In this embodiment, the cooling coil 102 includes a plurality of bends 112 forming a serpentine shape perpendicular to the arc of the semi-circular portion 110. The cooling coil 102 of this embodiment provides cooling for a coil of long axial length while keeping thermal conduction paths within the coil itself short, thereby allowing heat to be removed from such a coil without an unacceptable temperature rise at the ends of the coil.

FIGS. 4A-4C illustrate additional features and embodiments based on the embodiment illustrated in FIG. 2A. Preferably, the bends 112 in the cooling coil 102 are angled such that a gas bubble in a liquid cryogen in the cooling tube 102 would flow upwards under the force of gravity (FIG. 4C). Typically, the angle of the bends 112 is greater than 0 degrees. However as long as the angle at least 0 degrees, i.e. not negative, the gas bubble will not be trapped in the cooling coil 102. Thus, the cooling coil 102 will not suffer vapor lock.

Optionally, filler pieces 114 may be included between the bends 112 in the cooling coil 102. Preferably, the height of the filler pieces is approximately the same as the thickness of the cooling coil 102. Typically, the filler pieces are made a polymeric material, preferably a phenolic polymer. Further, in a preferred embodiment, the cooling coil 102 has a diameter less than about 7 mm. More preferably, the cooling coil 102 has a diameter greater than about 3 mm and less than about 7 mm.

When fabricating the low eddy current cryogen circuit 100 according to the above embodiments of the invention, the cooling coil 102 may be first formed into a semicircular shape and affixed to a backing 116, with or without filler pieces 114. Optionally, the cooling coil 102 and the filler pieces may be affixed to a flexible backing 116 and then bent into a semicircular shape. The backing 116 with the filler pieces 114 and the cooling coil 102 can then be put in thermal contract with a superconducting coil.

The previous embodiments of the invention involved the use of a single cooling coil 102. In another preferred embodiment (illustrated in FIG. 4A), a cooling band 122 is formed with the addition of a second cooling coil 118 having at least a second electrical isolator 120 incorporated in the second cooling coil 118. As with the first cooling coil 102, the second electrical isolator 120 is located to inhibit induced magnetic fields due to inductive coupling of the second cooling coil 118 with eddy current inducing field sources. Further, both the first and second cooling coils 102, 118 have substantially semicircular portion 110. Preferably, the first and second cooling coils 102, 118 are located relative to each other to form a cooling band 122 having a substantially circular shape.

Figure 3A:
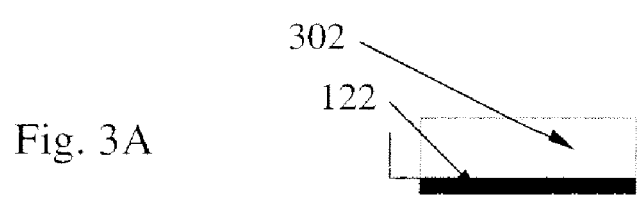
FIG. 3A is a cross section of a cooling band according to an according to another embodiment of the present invention.

The cooling band 122 can be wrapped around a superconducting coil 302 to provide cooling around the entire circumference of the superconducting coil 302 (FIG. 3A). Further, if the superconducting coil has a long axial length, a plurality of cooling bands 122 can be provided. If a plurality of cooling bands 122 is provided, manifolds 123 (FIG. 1), may also be provided to distribute cryogen among the plurality of cooling bands 122.

Figure 3B:
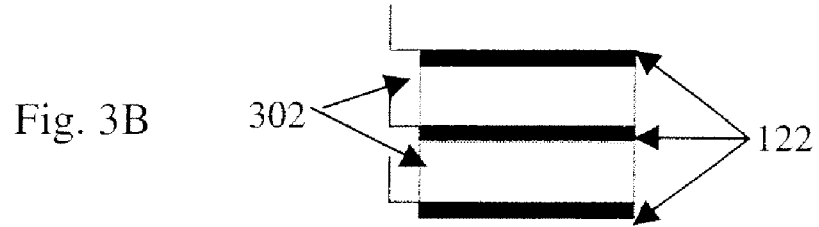
FIG. 3B a cross section of a cooling band according to another embodiment of the present invention.

In still another embodiment of the invention illustrated in FIG. 3B, at least some of the plurality of cooling bands 122 are incorporated within windings of the superconducting coil 302. This embodiment may be used with thick superconducting coils 302 which may otherwise suffer hot spots within the superconducting coil 302. Further, this embodiment may be combined with the last embodiment. That is, a plurality of cooling bands 122 may be incorporated both within the windings of the superconducting coil 302 and axially along the super conducting coil 302.

In a preferred embodiment of the invention, the low eddy current cryogen circuit 100 includes a liquid cryogen reservoir 124 fluidly connected to the first and second cooling coils 102, 118 of the cooling band 122 (FIG. 1). Preferably, the liquid cryogen reservoir 124 is located above the first and second cooling coils 102, 118 and is fluidly connected to an input portion 106 located at the bottom of the first and second cooling coils 102, 118. With this arrangement, liquid cryogen flows upward through the cooling band 122. This configuration assists the flow of any vapor formed by evaporation of liquid cryogen through the cooling band 122 and inhibits the formation of a vapor lock in the cooling band 122.

In another preferred embodiment, the low eddy current cryogen circuit 100 includes at least one thermal shield 128. The thermal shield 128 intercepts radiation from the ambient atmosphere to the superconducting magnet of a superconducting magnetic device, for example an MRI. Preferably, the thermal shield 128 includes least one thermal shield cooling coil 130 circumscribing the thermal shield 128. Cryogen is introduced to the thermal shield cooling coil 130 via an input portion 131A at one temperature and removed via an output portion 131B at a higher temperature after removing heat from the thermal shield 128. Preferably, like the cooling coils 102, 118 in the cooling bands 122, the thermal shield cooling coil 130 includes at least one electrical isolator 132 inhibit induced magnetic fields due to inductive coupling of the thermal shield cooling coil 130 with eddy current inducing field sources.

In another embodiment, the thermal shield 128 may be circumscribed by a plurality of thermal shield cooling coils 130. If a plurality of thermal shield cooling coils 130 is provided, manifolds 123, may also be provided to distribute cryogen among the plurality of thermal shield cooling coils 130.

Preferably, the low eddy current cryogen circuit 100 includes a cryocooler 134 and a condenser 136 thermally connected to the cryocooler 134. More preferably, the output portion 108 at the top of the cooling coils 102, 118 are fluidly connected to the condenser 136. In this embodiment, vaporized cryogen may be directed to the condenser 136, liquefied, and then sent to the liquid cryogen reservoir 124 to be reused.

In another embodiment of the invention, the cryocooler 134 has two stages 135A, 135B. In this embodiment, the condenser 136 is thermally connected to the second stage 135B of the cryocooler 134 while the thermal shield cooling coil 130 is thermally connected to the first stage 135A of the crycooler 134. Further, in this embodiment, the low eddy current cryogen circuit 100 may be described as comprising two subcircuits, a coil cooling subcircuit 200 and a thermal shield subcircuit 202. The coil cooling subcircuit 200 includes the liquid cryogen reservoir 124, the cooling bands 122 and the condenser 136. The thermal shield subcircuit 202 includes the thermal shield cooling coil 130 the first stage 135A of the cryocooler 134.

In a preferred aspect of this embodiment, the coil cooling subcircuit 200 and the thermal shield subcircuit 202 may be connected with a first pressure relief valve 138. If the pressure in the coil cooling subcircuit 200 exceeds a pre-set pressure, cryogen vapor from the coil cooling subcircuit 200 can be released into the thermal shield subcircuit 202. In this manner, the pre-set pressure balances the cooling capacity of the second stage 135B of the cryocooler with the heat load of the from the cooling bands 122.

Optionally, a second pressure relief valve 140 may be included to vent the thermal shield subcircuit 202 to the atmosphere. Thus, if the pressure in the thermal shield subcircuit 202 exceeds a second pre-set pressure, cryogen vapor in the thermal shield subcircuit 202 can be released to the atmosphere to reduce the pressure in the thermal shield subcircuit 202 and hence, reduce the pressure in the low eddy current cryogen circuit 100. Preferably, the pressure in the low eddy current cryogen circuit 100 is always above atmospheric pressure during operation. In this manner, atmospheric pressure will not inhibit operation of the low eddy current cryogen circuit 100 due to ingress of air from outside the low eddy current cryogen circuit 100.

Additionally, a one-way valve 142 may be included between the first stage 135A of the cryocooler and the infeed portion 131A of the thermal shield cooling coil. The one-way valve 142 provides added control over the vapor pressure in the thermal shield subcircuit 202. That is, the one-way valve ensures that cold cryogen flows down to the thermal shield cooling coil 130 and removes heat from the thermal shield 128 during the cool-down procedure and during failure of cooling system due to a power failure or a mechanical failure in the cooling system.

To provide even further control over the pressure in the low eddy current cryogen circuit 100, in another embodiment of the invention, a heater 126 is located inside the cryogen reservoir 124. The heater 126 is turned on whenever the pressure in the cryogen reservoir 124 drops below a pre-set pressure. In this manner, the cooling capacity of the cryocooler 134 can be balanced with the heat load from the cooling bands 122.

FIG. 5 illustrates an MRI system 300 comprising a low eddy current cryogen circuit 100. The MRI system 300 includes several superconducting magnets 302, a thermal shield 128, gradient coils 306, an RF coil 308, and an RF shield 310 within a housing 312. The housing 312 includes a central bore 304 for the patient. In this embodiment, cooling bands 122 are located on an outer surface of the coil of superconducting magnets 302. Additionally, thermal shield coils 130 are located on an outer surface of the two thermal shields 128.

In this embodiment, the cooling bands 122 may include cooling coils 102, 118 having simple semi-circular shapes as illustrated in FIG. 2B or having serpentine bends 112 as illustrated in FIG. 2A. Further, unlike prior art MRI systems which required a cryogen vessel within the housing 312, the present MRI system 300 does not require an internal cryogen vessel. In the MRI system according to the present embodiment, the liquid cryogen reservoir 124 may be located outside of the housing 312 and be connected via pipes or tubing (not shown).

Further, in the event of a power failure or a mechanical failure in the cooling system, the latent heat of the cryogen in the liquid cryogen reservoir 124 is available to provide "ride-through" (the period of time from the failure of the cooling mechanism to the loss of superconductivity due to a rise in temperature above the critical temperature of the superconducting material). During ride through, the pressure in the low eddy current cryogen circuit 100 rises and both pressure relief valves 138, 140 open. Cryogen boiling off the cooling bands 122 flows into the thermal shield subcircuit, through the thermal shield cooling coil 130 and vents to atmosphere. Preferably, if the cryocooler 134 fails, cryogen in the liquid cryogen reservoir 124 provides latent cooling for ride-through for at least 4 hours. More preferably, cryogen in the liquid cryogen reservoir 124 provides latent cooling for ride-through for at least 12 hours.

The preferred embodiments have been set forth herein for the purpose of illustration. However, this description should not be deemed to be a limitation on the scope of the invention. Accordingly, various modifications, adaptations, and alternatives may occur to one skilled in the art without departing from the scope of the claimed inventive concept.

What is claimed is:

1. A method of making a cooling band comprising:
    providing a first cooling coil and a second cooling coil, the first and second cooling coils having a substantially semicircular portion; and
    affixing the first and second cooling coils to a flexible backing such that the first and second cooling coils form a substantially circular shape;
    wherein the first and second cooling coils have a plurality of bends forming a serpentine shape.

2. The method of claim 1, wherein the bends in the first cooling coil are angled such that a gas bubble in a liquid in the first cooling tube would flow upwards under the force of gravity.

3. The method of claim 1, further comprising affixing filler pieces between the bends in the first and second cooling coils.

4. The method of claim 3, wherein the filler pieces comprise a polymer.

5. The method of claim 4, wherein the polymer comprises a phenolic polymer.

6. The method of claim 1, wherein the cooling coils comprise stainless steel or copper.

7. The method of claim 6, further comprising incorporating an electric isolator in the first and second cooling coils.

8. The method of claim 7, wherein the first cooling coil has first and second portions and the second cooling coil has third and fourth portions and the step of incorporating comprises inserting tubes comprising an electrically insulating material in between the first and second portions of the first cooling coil and in between the third and fourth portions of the second cooling coil.

9. The method of claim 7, wherein the electric isolator comprises ceramic.

10. An MRI system comprising:
    a housing;
    magnets, held in the housing, about a central bore configured to receive a patient;
    a coil structure made of conductive materials held within the housing and located about the central bore, the coil structure including at least one of RF and gradient coils, wherein at least a portion of the coil structure is tubular and constructed to carry a cooling liquid therethrough in order to provide cooling for the MRI system;
    at least one electrical isolator incorporated in the portion of the coil structure, the electrical isolator located to inhibit induced eddy current loops in the coil structure due to inductive coupling of the portion of the coil structure with eddy current inducing field sources.

11. The MRI system of claim 10, wherein the electrical isolator comprises a ceramic tube.

12. The MRI system of claim 10, wherein the eddy current inducing field sources include magnetic field sources or AC field sources.

13. The MRI system of claim 10, wherein the portion of the coil structure constitutes a cryogenic tube.

14. The MRI system of claim 10, wherein the at least one electrical isolator includes a non-electrically conducting tube coupled to an end of the portion of the coil structure.

15. The MRI system of claim 10, wherein the coil structure further comprises a first cooling coil incorporated within a winding of a conducting coil of the MRI system.

16. The MRI system of claim 10, wherein the coil structure further comprises a first cooling coil incorporated axially along a conducting coil of the MRI system.

17. The MRI system of claim 10, wherein the coil structure further comprises a first cooling coil located on an outer surface of a conducting coil of the MRI system.

18. The MRI system of claim 10, wherein the coil structure includes at least one of RF and gradient coils.

19. The MRI system of claim 10, wherein the at least one electrical isolator interrupts a path of at least one of an RF coil, a gradient coil and a cooling coil of the MRI system.

* * * * *